United States Patent [19]

Nakai et al.

[11] Patent Number: 5,037,704
[45] Date of Patent: Aug. 6, 1991

[54] HARD SINTERED COMPACT FOR A TOOL

[75] Inventors: Tetsuo Nakai; Akio Hara; Mitsuhiro Goto, all of Itami, Japan

[73] Assignee: Sumitomo Electric Industries, Ltd., Osaka, Japan

[21] Appl. No.: 932,640

[22] Filed: Nov. 19, 1986

[30] Foreign Application Priority Data

| Nov. 19, 1985 | [JP] | Japan | 60-260589 |
| Dec. 18, 1985 | [JP] | Japan | 60-282776 |
| Feb. 14, 1986 | [JP] | Japan | 60-31386 |

[51] Int. Cl.$^5$ ............................................. B22F 3/10
[52] U.S. Cl. ................................ 428/550; 428/552; 428/553; 428/557; 428/565; 428/673; 428/684; 428/698; 428/408
[58] Field of Search ............... 428/550, 553, 557, 552, 428/565, 673, 684, 698, 408

[56] References Cited

U.S. PATENT DOCUMENTS

| 3,999,954 | 12/1976 | Kolaska et al. | 428/565 |
| 4,239,536 | 12/1980 | Yamamoto et al. | 428/565 |
| 4,293,618 | 10/1981 | Hara et al. | 428/565 |
| 4,334,928 | 6/1982 | Hara et al. | 428/565 |
| 4,374,900 | 2/1983 | Hara et al. | 428/565 |
| 4,403,015 | 9/1983 | Nakai et al. | 428/565 |
| 4,442,180 | 4/1984 | Hara et al. | 428/565 |
| 4,450,205 | 5/1984 | Itaba et al. | 428/552 |
| 4,505,746 | 3/1985 | Nakai et al. | 75/236 |
| 4,649,084 | 3/1987 | Hale et al. | 428/565 |

FOREIGN PATENT DOCUMENTS

| 5417914 | 2/1979 | Japan | 428/565 |
| 56-152937 | 11/1981 | Japan | 428/565 |
| 2061324 | 5/1981 | United Kingdom | 428/565 |

*Primary Examiner*—Stephen J. Lechert, Jr.
*Attorney, Agent, or Firm*—Wenderoth, Lind & Ponack

[57] ABSTRACT

A sintered diamond compact or high pressure form boron nitride compact with an improved brazability, suitable for use for wear resisting tools, cutting tools, drill bits, dressers and wire-drawing dies is provided. This compact comprises a compact part containing at least 20% by volume of diamond and/or high pressure form boron nitride and a cemented carbide substrate bonded directly or through an interlayer to the compact part, characterized in that the surface of the compact is coated, at least partly, with a thin film consisting essentially of at least one member selected from the group consisting of carbides, carbonitrides and nitrides and mixtures or solid solutions thereof of at least one element selected from the group consisting of silicon and Group IVa, Va and VIa of Periodic Table, and having a thickness of 1 to 20 μm.

11 Claims, 6 Drawing Sheets

HARD SINTERED COMPACT FOR A TOOL

BACKGROUND OF THE INVENTION

1. Field of the Invention

This invention relates to an improvement in a sintered diamond compact or high pressure form boron nitride (BN) compact and more particularly, it is concerned with a sintered diamond compact or high pressure form BN compact with an improved brazability, used for wear resisting tools, cutting tools, drill bits, dressers, wire-drawing dies and the like.

2. Description of the Prior Art

Diamond compacts obtained by sintering diamond fine grains with an iron group metal as a binder under an ultra-high pressure and high temperature have a more excellent wear resistance as edge materials of cutting tools, wire-drawing dies or drill bits, as compared with the prior art cemented carbides. In many cases, these compacts are bonded directly or through an interlayer to substrates of cemented carbides, as shown in FIG. 1 (a) and (b). The cemented carbides are used for the purpose of making it possible to braze a diamond compact to a tool holder or reinforcing a diamond compact.

In the case of a use wherein a diamond compact has a larger volume than its substrate as shown in FIG. 2, however, the bonding strength is often insufficient when only the substrate, i.e. cemented carbide is brazed. In this case, it has been considered to coat a diamond compact 1 with a cemented carbide 2 on the outer circumference and bottom of the diamond compact as shown in FIG. 3 (a) and (b) to increase the brazing area, but this results in a problem that the shape of a diamond compact is limited and it is hard to obtain a dimensional precision. When the volume of a diamond compact is larger than that of a cemented carbide, there arises a problem that cracks tend to occur in the diamond compact or cemented carbide due to the residual stress during sintering under an ultra-high pressure or the stress resulting from the differences of thermal expansion among the diamond compact, cemented carbide and a shank to be brazed.

Furthermore, these composite compacts of diamond or high pressure form BN meet with a disadvantage that the part of the diamond compact or high pressure form BN 1 is hardly wettable with a brazing filler 4 to form a clearance between the compact part 1 and a holder 3, as shown in FIG. 4 (a) and (b). When a stress in parallel with the bonded surface with a cemented carbide substrate 2 acts as shown by arrows in FIG. 4 (a) and (b), therefore, the effect of reinforcing by the cemented carbide substrate is lost, resulting in occurrence of cracks in the compact and breakage of the edge part.

Accordingly, the compacts of the prior art can be applied to only uses wherein a stress is loaded in the perpendicular direction to the bonded surface with a cemented carbide substrate. When these compacts are small-sized, there arises a problem that since only the cemented carbide substrate is brazed, the brazing strength is lowered and the brazing is get out of place.

In the specification the designation of groups IVa, Va and VIa of the periodic table corresponds to the conventional U.S. designation of groups IVb, Vb, and VIb in the periodic table.

A compact of high pressure form boron nitride bonded with a suitable binder has an excellent performance for cutting hardened steels, cast iron and heat resisting alloys, since high pressure form BN has less reactivity with iron group metals. In particular, a compact of cubic boron nitride (CBN), one kind of high pressure form boron nitrides, bonded with a carbide, carbonitride or nitride of Group IVa, Va or VIa element of Periodic Table, and an aluminum compound has an excellent wear resistance and toughness for cutting the above described workpieces. In many cases, these compacts are bonded directly or through an interlayer to substrates of cemented carbides, as shown in FIG. 1 (a) and (b). The cemented carbides are used for the purpose of making it possible to braze a CBN compact to a tool holder or reinforcing a CBN compact.

In the case of a use wherein a high pressure form BN has a larger volume than its substrate as shown in FIG. 2, however, the bonding strength is often insufficient when only the cemented carbide part is brazed. In this case, if a high pressure form BN compact is coated with a cemented carbide for brazing, there arises a problem that the shape of the high pressure form BN compact is limited. When the volume of a high pressure form BN compact is larger than that of a cemented carbide, furthermore, there arises a problem that cracks tend to occur in the BN compact or cemented carbide due to the residual stress during sintering under an ultra-high pressure or the stress resulting from the differences of thermal expansion among the BN compact, cemented carbide and a shank to be brazed.

At the present time, diamond compacts for tools have been marketed in which at least 70% by volume of diamond grains are bonded with each other. These compacts are used as cutting tools of non-ferrous metals, plastics or ceramics, dressers, drill bits or wire-drawing dies. When using the diamond compact for cutting non-ferrous metals or for drawing relatively soft wires such as copper wires, in particular, it exhibits very excellent properties.

These diamond compacts are ordinarily sintered by using, as a binder, an iron group metal such as cobalt, the catalyst for the synthesis of diamond. Therefore, the diamond compacts have a disadvantage that when heating at a temperature of higher than 600° C., diamond is graphitized and degraded. Thus, in order to improve the heat resistance of the diamond compact, it has been proposed to remove the iron group metal such as cobalt promoting graphitization of diamond during heating, as disclosed in Japanese Patent Application OPI (Kokai) No. 114589/1978. The diamond compact from which the solvent metal has thus been removed is capable of surely resisting a temperature of up to about 1200° C. in high vacuum.

However, the solvent metal-removed diamond compact has still an insufficient heat resistance when heated in the air. When the diamond compact being a porous body is heated at a temperature of up to 900° C., diamond grains on and inside the surface are brought into direct contact with oxygen, thus resulting in graphitization and degradation of the surfaces of the diamond grains.

The diamond compact is fitted to a bit main body or shank, as an edge of a drill bit or dresser, by the use of a matrix or brazing alloy. The holding strength of a matrix is increased with the increase of the melting point of the matrix material, so in the case of using the above described diamond compact as an edge material of a drill bit for drilling hard rocks, in particular, it is necessary to use a brazing alloy and a matrix each having a melting point of higher than 900° C. When fitting the diamond compact under the situation, therefore, the diamond compact is heated at a temperature of 800° to 1100° C. in the air and thus degraded, so that it is impossible to obtain a sufficient strength in the resulting drill bit or dresser.

Thus, it will be understood that a further improvement of the heat resistance of the diamond compact can be achieved by preventing it from exposure to the atmosphere during heating and based on this understanding, a heat resistance diamond compact has lately been marketed which is prepared, for example, by coating the surface of a diamond compact with nickel.

SUMMARY OF THE INVENTION

It is an object of the present invention to provide an improved hard compact used for wear resistance tools, cutting tools, drilling tools, dressers and wire-drawing dies.

It is another object of the present invention to provide a diamond or high pressure form boron nitride compact capable of being strongly brazed and free from occurrence of cracks.

It is a further object of the present invention to provide a hard sintered compact for a tool, which is partly or completely coated with a thin film having a good wettability and brazability.

It is a still further object of the present invention to provide a diamond compact excellent in heat resistance.

These objects can be attained by a hard sintered compact for a tool, comprising a compact part containing at least 20% by volume of diamond and/or high pressure form boron nitride and a cemented carbide substrate bonded directly or through an interlayer to the compact part, characterized in that the surface of the compact part is coated, at least partly, with a thin film consisting essentially of at least one member selected from the group consisting of carbides, carbonitrides, nitrides and mixtures thereof or solid solutions thereof of at least one metal selected from the group consisting of silicon and Groups IVa, Va and VIa elements of Periodic Table, and having a thickness of 1 to 20 $\mu$m.

BRIEF DESCRIPTION OF THE INVENTION

The accompanying drawings are to illustrate the principle and merits of the present invention in more detail.

FIGS. 1 (a) and (b) are perspective views of embodiments of composite compacts used in the present invention.

FIG. 2 is a perspective view of one embodiment of a composite compact used in the present invention, having a larger compact part than a substrate part.

FIGS. 3 (a) and (b) are respectively a plan view and side view of one embodiment of a composite compact having a larger compact part than a substrate part.

FIGS. 4 (a) and (b) are respectively a cross-sectional view and perspective view of examples of the prior art, in which hard compacts are brazed to holders.

FIGS. 5 (a) and (b) are respectively a plan view and side view of one embodiment of a diamond or high pressure form BN compact of the present invention, brazed to a holder of stainless steel.

Figure 12A:
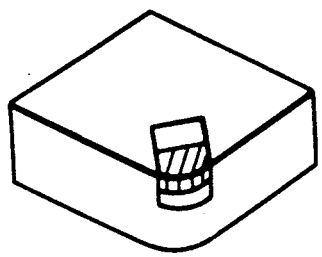
Figure 12B:
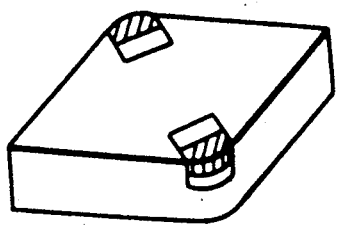

FIGS. 12 (a) and (b) are respectively perspective views of other examples of hard compacts brazed to holders according to the present invention.

Figure 13:
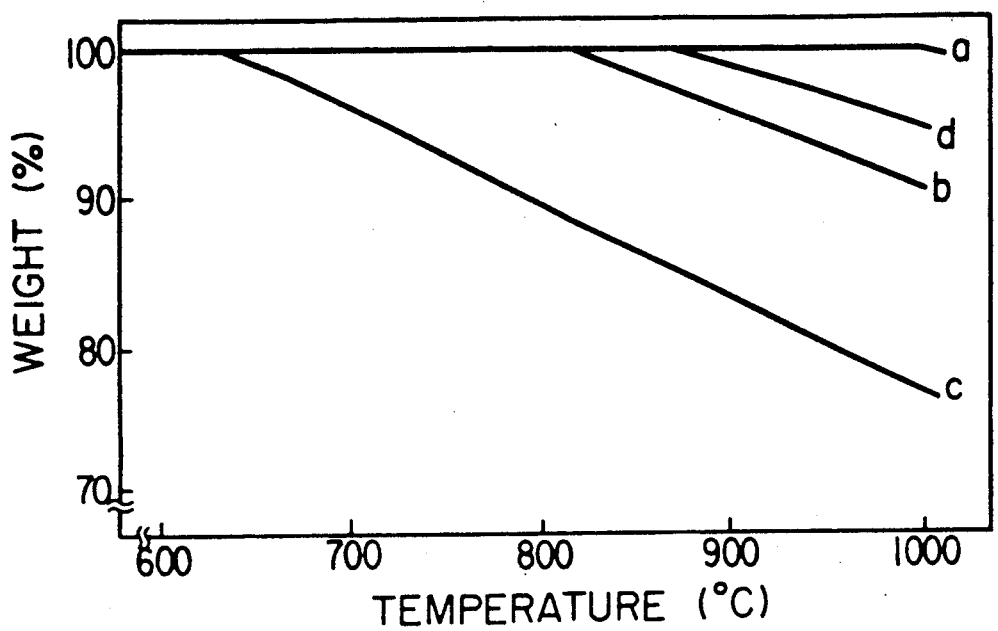

FIG. 13 is a graph showing the weight change of a heat resistance diamond compact of the present invention due to heating.

Figure 14:
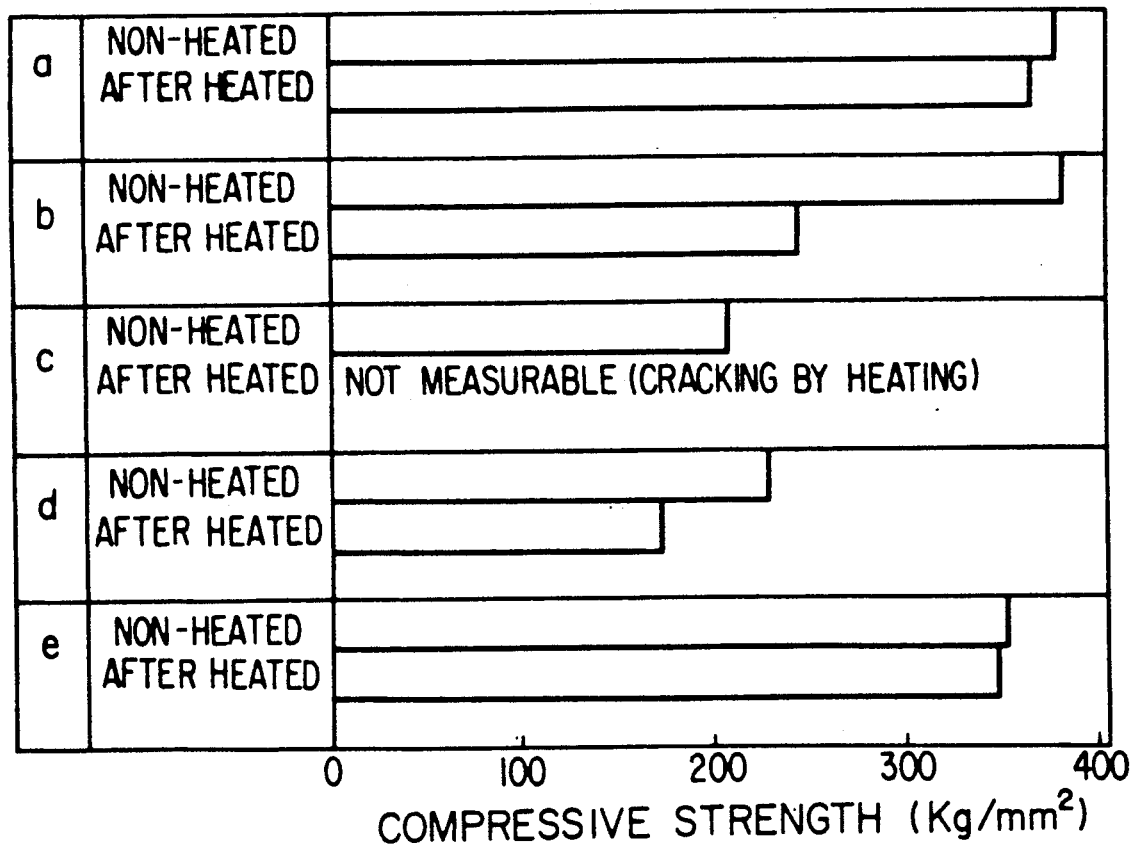

FIG. 14 is a graph showing the compressive strengths of diamond compacts before and after heating in the air.

Figure 15:
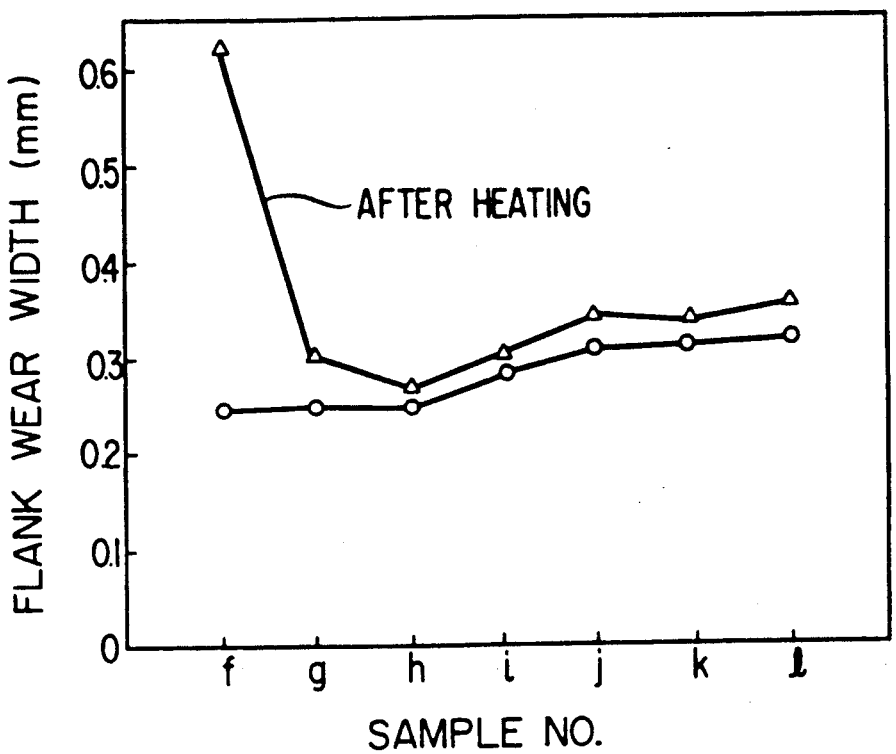

FIG. 15 is a graph showing the wear resistances of diamond compacts before and after heating in the air.

Figure 16:
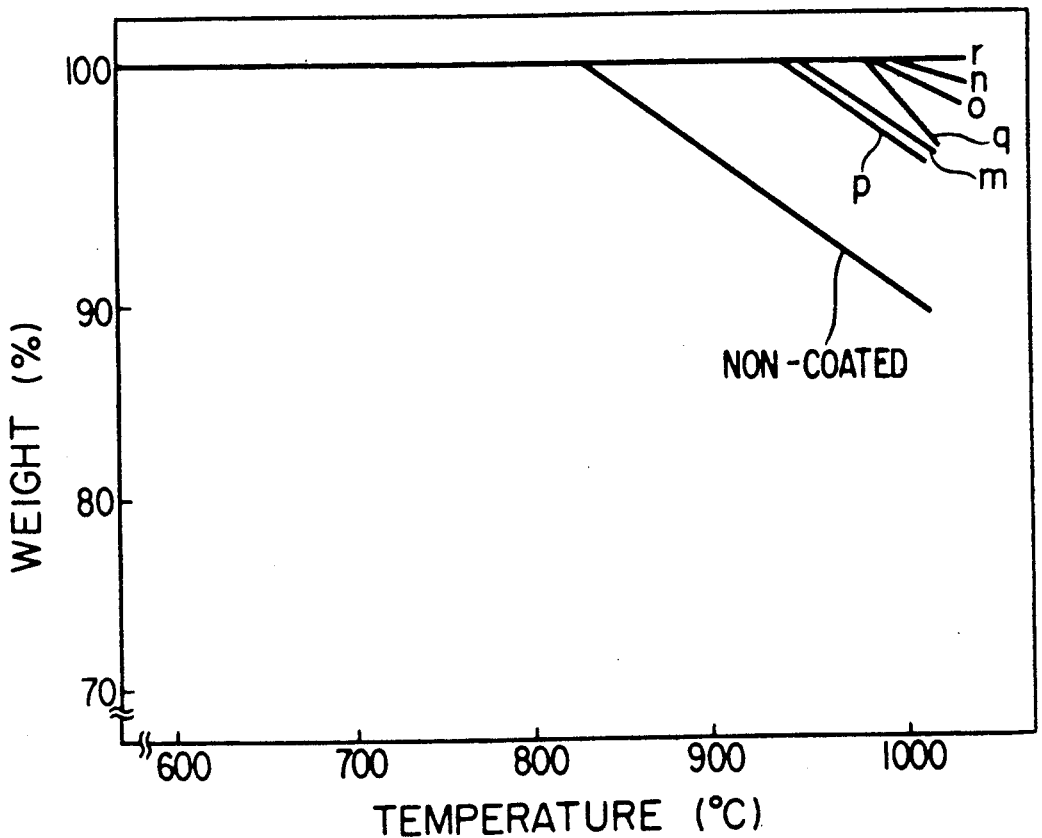

FIG. 16 is a graph showing the weight change of diamond compacts coated with various carbide coating materials with the change of temperature.

Figure 17:
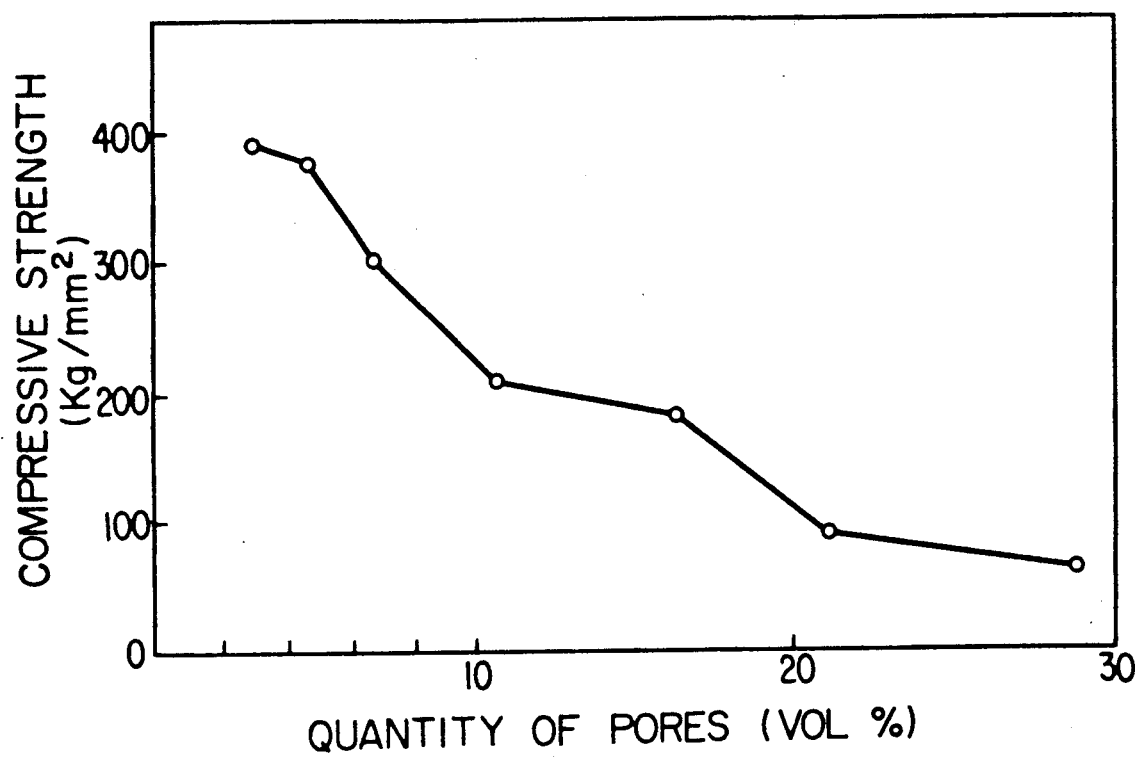

FIG. 17 is a graph showing the relationship of the compressive strength and the quantity of pores in a diamond compact of the present invention.

Figure 18:
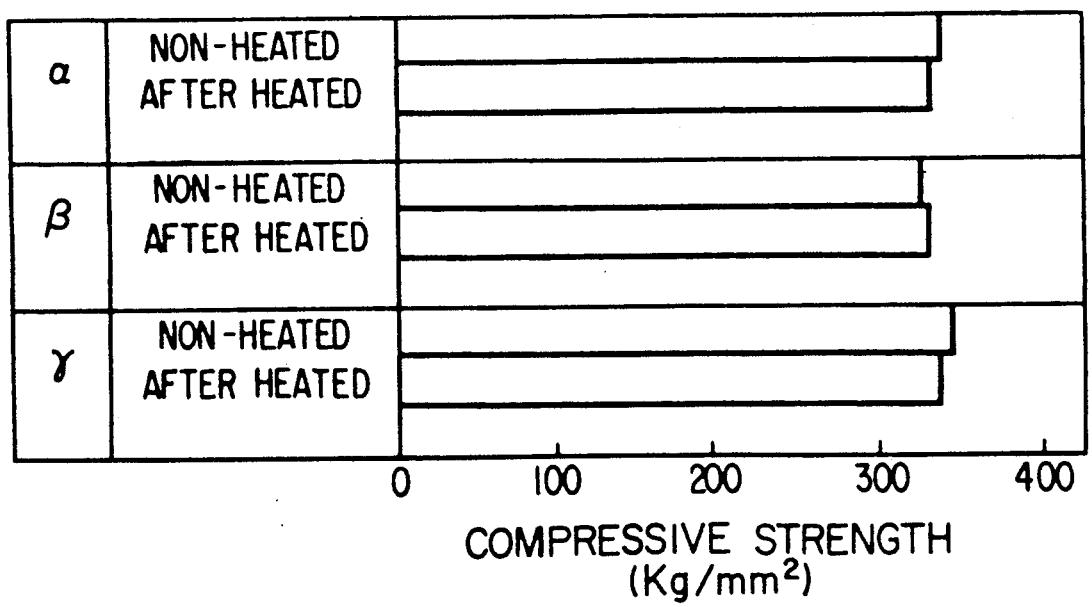

FIG. 18 is a graph showing the compressive strengths of diamond compacts coated with various coating materials when heating at 950° C. or without heating.

DETAILED DESCRIPTION OF THE INVENTION

The inventors have made various efforts to develop a diamond or high pressure form BN compact which can be brazed with a high brazing strength, and have made studies on coating materials on the diamond or high pressure form BN compact, which materials are not degraded through reaction therewith, but are excellent in brazability as well as heat resistance. The inventors have examined the heat resistance of a diamond compact coated with a nickel film according to the prior art by heating it at 900° C. in the air consequently, have found that diamond is graphitized at the boundary between the nickel coating layer and diamond layer, thus causing breakage when used as an edge of a drill bit or dresser.

Accordingly, the present invention provides a hard sintered compact for a tool, comprising a compact part containing at least 20% by volume of diamond or high pressure form BN grains and a cemented carbide substrate bonded directly or through an interlayer to the compact part, in which the surface of the compact part is coated, at least partly, with a thin film consisting essentially of at least one member selected from the group consisting of carbides, carbonitrides, nitrides and mixtures thereof or solid solutions thereof of at least one metal selected from the group consisting of silicon and Groups IVa, Va and VIa elements of Periodic Table, and having a thickness of 1 to 20 $\mu$m, whereby the coated thin film is wetted with a brazing agent and the hard sintered compact can be bonded with a holder and made heat-resistant even if heated at a temperature of 900° C. or higher in the air.

In this specification, the high pressure form boron nitride will be referred to as "BN" simply and defined as including cubic boron nitride (CBN) and wurtzitic boron nitride (wBN) as usual. The cemented carbide includes hard sintered alloys consisting of at least one member selected from the group consisting of carbides, carbonitrides, nitrides and carboxynitrides of Group IVa, Va and VIa elements of Periodic Table and solid solutions thereof, bonded by at least one member selected from iron group metals. Preferred examples are hard sintered alloys consisting of WC or MoC or (Mo, W)C bonded with Co or Ni.

It is further found that the compact part can also be brazed to increase the bonded area and even if a stress is added in parallel with the bonded surface with the cemented carbide substrate, a holder is capable of playing a reinforcing role, thereby effectively preventing the hard compact from cracking or breaking.

In a preferred embodiment of the present invention, the diamond compact contains 20% by volume or more of diamond and in particular, a sintered diamond compact comprising 80% by volume or more of diamond and the balance of a binder consisting of at least one member selected from the group consisting of iron group metals and carbides of at least one metal selected from the Group IVa, Va and VIa elements of Periodic Table is more preferable because of having a particularly excellent wear resistance.

The above described diamond compact having an excellent wear resistance meets with graphitization of the diamond by an iron group metal or with occurrence of cracks due to difference of the thermal expansions of the diamond and iron group metal or carbide at a higher temperature, e.g. higher than 750° C. Therefore, it is necessary to strongly bond a carbide thin film onto the diamond compact at a temperature of at most 750° C.

For the formation of a thin film capable of satisfying the above described requirements, there are plasma assisted CVD methods and PVD coating methods. When such a thin film is formed, heating of the diamond compact as a base material at a temperature of 500° C. or higher results in a stronger bonding strength of the thin film to the diamond compact.

The interlayer used in the above described hard sintered compact consists generally of a mixture of CBN and Al or Si and at least one member selected from the group consisting of carbides, nitrides and carbonitrides of Group IVa, Va and VIa elements of Periodic Table, for example, of 60 volume % CBN-30% TiN-10% Al.

The reasons can be considered as follows why the diamond compact of the present invention exhibits an excellent brazing strength: Firstly, a carbide as a thin film forms a solid solution at the bonding interface with a carbide in the diamond compact. Secondly, a carbide as a thin film has a good wettability for an iron group metal in the diamond compact. Thirdly, a carbide component as a thin film forms a bonding with carbon on the surface of the diamond compact. In a case where the quantity of carbon atoms is less than the stoichiometric value as shown by $MC_{1-x}$ (M represents a metal), in particular, the free metal and carbon atom of diamond are bonded to raise the bonding strength. In this general formula, the value of (1-x) is preferably in the range of 0.5 to 0.975. Furthermore, it is considered that the thin film of the carbide has a good wettability with a silver braze or copper braze such as to give a high brazing strength.

In another embodiment of the present invention, there is provided a high hardness compact for a tool, capable of brazing, comprising a compact containing at least 20% by volume of high pressure form BN, the whole part or most part of which is coated with a thin film consisting of a carbide, nitride, carbonitride of Group IVa, Va or VIa element, or mixture or solid solution thereof and having a thickness of 1 to 20 μm.

More preferably, the thin film consists of a carbide of at least one element of Group IVa, Va and VIa of Periodic Table, or a mixture or solid solution of the two or more carbides.

In particular, a high pressure form BN compact comprising 20 to 90% by volume of high pressure form BN and the balance of at least one member selected from the group consisting of nitrides, carbides, carbonitrides and borides of at least one metal selected from the group consisting of Group IVa, Va and VIa metals of Periodic Table, mixtures and solid solutions thereof, as a binder, and optionally at least 1% by volume, based on the whole of the binder, of Al and/or Si is more preferable because of having an excellent wear resistance and toughness in cutting high hardness iron group metals.

The hard compacts having these excellent properties meet various problems at a temperature of higher than 750° C., for example, occurrence of cracks due to differnece of the thermal expansions of the binder and diamond or high pressure form BN, transformation of diamond or high pressure form BN into a low pressure form, that is, graphitization in the case of diamond or transformation into hexagonal BN in the case of high pressure form. Therefore, it is necessary to strongly bond a carbide thin film onto the hard compact at a temperature of lower than 750° C.

The reasons can be considered as follows why the high pressure form BN compact of the present invention gives a higher brazing strength: When using a carbide of a metal of Group IVa, Va and VIa of Periodic Table as a thin film material and a carbide, nitride, carbonitride or boride of a metal of Group IVa, Va and VIa of Periodic Table as a binder, for example, it can be assumed that the thin film carbide and binder form a mutual solid solution at the bonding interface whereby the thin film and compact are strongly bonded. In particular, where the thin film component consists of such a carbide that the quantity of carbon atoms is less than the stoichiometric value as represented by $MC_{1-x}$ (M is an element of Group IVa, Va and VIa of Periodic Table), the nitrogen from the high pressure form BN and freed M react to increase the bonding strength. In this general formula, the value of $(1-x)$ is preferably in the range of 0.5 to 0.975. Furthermore, it is considered that the thin film of the carbide has a good wettability with a silver braze or copper braze such as to give a high brazing strength.

In the high pressure form BN compact of the present invention, the coating film has preferably a thickness of 1 to 20 μm, since if the film thickness is less than 1 μm, it is hard to coat completely the surface of the high pressure form BN compact as a base material, thus resulting in lowering of the brazing strength, while if more than 20 μm, a lot of time is taken for coating, thus increasing the cost of forming the coating layer. That is, the upper limit of the film thickness is provided mainly based on economical reasons rather than technical reasons.

In this embodiment, it is particularly desirable to use titanium carbide for the coating layer, because titanium carbide has a coefficient of thermal expansion of $8 \times 10^{-6}$ which is similar to that of a high pressure form BN compact, i.e. about 5 to $7 \times 10^{-6}$ although depending on the composition of a binder and the content of high pressure form BN, and which is particularly stable at a high temperature in the atmosphere.

For the formation of a thin film capable of satisfying the above described requirements, there are CVD, plasma assisted CVD, PVD and reactive sputtering methods. When such a thin film is formed, heating of the high pressure form BN compact as a base material at a temperature of 500° C. or higher results in a higher bonding strength of the thin film to the BN compact.

In a further preferred embodiment of the present invention, there is provided a heat resisting diamond compact comprising 80 to 99% by volume of diamond powder, 0.5 to 19.9% by volume of pores and 0.1 to 3% by volume of a carbide of a transistion metal of Group IVa, Va or VIa of Periodic Table, and having a coating layer consisting of at least one member selected from the group consisting of carbides, nitrides and carbonitrides of transition metals of Group IVa, Va and VIa of Periodic Table and silicon and having a thickness of at least 1 μm.

The reasons why the heat resistance of the diamond compact of this embodiment in the atmosphere is improved can be considered as follows:

A material suitable for the coating layer provided on the diamond compact must have the requirements that its coefficient of thermal expansion is similar to that of the diamond compact and it is strongly bonded with diamond and prevents diamond from graphitization. Under the situation, the above described materials forming the coating layer have the following properties:

a) Carbides, nitrides or carbonitrides of transition metals of Group IVa, Va and VIa of Periodic Table have coefficients of thermal expansion similar to that of diamond and thin films consisting of these materials are free from cracks.

b) Thin films consisting of these materials are excellent in oxidation resistance.

c) These materials do not have a catalytic action like cobalt, nor an action of graphitizing diamond.

d) These materials are strongly bonded with the diamond compact and have such a good wettability to metals that they can strongly be brazed. For example, titanium carbide has an excellent wettability with a silver braze and silicon carbide has a good wettability with a copper-manganese alloy.

In the nickel coating layers of the prior art, it can be assumed that graphite is formed at the interface with diamond since nickel has a catalytic action like cobalt.

In this embodiment, the coating layer has preferably a thickness of 1 to 50 μm, since if the thickness is less than 1 μm, it is hard to coat completely the surface of the diamond compact as a base material, so that diamond grains on or inside the surface of the diamond compact be exposed to an oxidizing atmosphere and deteriorated by heating at a high temperature, while if more than 50 μm, a lot of time is taken for coating, thus increasing the cost of forming the coating layer. That is, the upper limit of the film thickness, i.e. 50 μm is provided mainly based on realistic and economical reasons rather than technical reasons.

In this embodiment, it is particularly desirable to use silicon carbide and titanium carbide for the coating layer, because silicon carbide and titanium carbide have respectively coefficients of thermal expansion of $6 \times 10^{-6}$ and $8 \times 10^{-6}$, similar to that of the diamond compact, i.e. $4.5 \times 10^{-6}$ and are particularly stable at a high temperature, e.g. 1000° C. in the atmosphere.

The diamond compact itself, used in this embodiment, is excellent in heat resistance in high vacuum and has the above described composition. When the diamond compact is applied to a use requiring a higher strength and higher wear resistance, in particular, even in the above described composition, it is preferable to use a heat resisting diamond compact described in Japanese Patent Application No. 24756/1984, i.e. comprising 95 to 99% by volume of diamond and 0.5 to 4.9% by volume of pores.

A diamond compact containing a solvent meets graphitization of diamond grains by the action of the solvent at a high temperature and deterioration due to difference of the coefficients of thermal expansion between the solvent and diamond. Thus, it is required that the diamond compact itself is excellent in heat resistance. The diamond compact used in this embodiment, having a diamond content of at least 95% by volume and less quantity of pores, is able to exhibit a largely raised heat resistance, strength and wear resistance.

In this embodiment, the above described coating layer can be formed on the surface of the diamond compact directly or through another coating layer. Furthermore, in any case, a further coating layer can be formed on the coating layer of the present invention.

These other coating layers can have a composition selected from the same group of the materials of the above described coating layer but different from that of the above described coating layer.

In the present invention, a sintered compact containing at least 20% by volume of diamond and/or high pressure form BN is coated, at least partly, with a thin film consisting essentially of at least one member selected from the group consisting of carbides, carbonitrides, nitrides and mixtures thereof or solid solutions thereof of at least one metal selected from the group consisting of Groups IVa, Va and VIa metals of Periodic Table and accordingly, this sintered compact can strongly be brazed without occurrence of cracks and can effectively be utilized for edges of drill bits, wire drawing dies, cutting tools, etc.

For example, a high pressure form BN compact can be made brazable in a relatively simple manner by coating the surface thereof with a thin film of a carbide of Group IVa, Va or VIa metal of Periodic Table such as titanium carbide and can be brazed to a tool holder, for example, consisting of a cemented carbide or steel with an excellent brazing strength and without occurrence of cracks, thus obtaining an excellent cutting tool.

Since the compact part in the hard sintered compact of the present invention can be brazed as illustrated above, the hard sintered compact can be brazed to a holder without retaining any clearance, and with an increased brazed area, the brazing strength can be more improved as compared with the hard compacts of the prior art.

Furthermore, the hard compact of the present invention can be freed from transformation of the crystal form or graphitization of diamond even if heated at a temperature of higher than 900° C. and can thus have an excellent heat resistance. Therefore, the hard compact of the present invention can strongly be bonded to a bit main body or shank as a tool holder by processing in the air using a high melting point matrix and brazing material, excellent in holding strength. The heat resisting hard compact of the present invention can be applied to various uses, for example, tool parts, dressers, drill bit blanks, wire drawing dies and cutting tools of ceramics.

The following examples are given in order to illustrate the present invention in greater detail without limiting the same.

EXAMPLE 1

Diamond powders each having an average grain size of 5 μm and 1 μm were mixed for 1 hour in a proportion of 3:1 by volume using a pot and balls, made of a cemented carbide of WC-10% Co. The resulting mixed powders were heated at 1500° C. for 30 minutes in vacuum and then charged in a Ta vessel, where the powders were covered with a Co plate. This vessel was charged in an ultra-high pressure and high temperature apparatus and held at a pressure of 53 kb and a temperature of 1450° C. for 10 minutes. The thus sintered compact was taken out of the vessel to separate a diamond compact.

The surface of the resulting diamond compact was cleaned by sputter etching and then coated with a thin film layer of titanium carbide having a thickness of about 5 μm by a plasma assisted CVD method comprising holding the diamond compact for 2 hours in mixed gases of $TiCl_4$, $CH_4$ and $H_2$ at 750° C.

This diamond compact was brazed to a cemented carbide by the use of a silver brazing material (JIS BAg-3) to measure the bonding strength. Observation of the brazed compact showed no occurrence of cracks. For comparison, cemented carbides were brazed with each other by the use of the same silver brazing material (JIS BAg-3) to measure the bonding strength.

The measurements showed that the brazed article of the present invention had a brazing strength of 26.3 kg/mm$^2$, while the comparative article had a brazing strength of 26.5 kg/mm$^2$. It is apparent from this result that the present invention provides a practical strength.

EXAMPLE 2

A diamond compact comprising 90% by volume of diamond grains with a mean grain size of 2 μm, 1% by volume of WC and 9% by volume of Co was prepared. Onto the surface of the diamond compact were deposited thin films shown in Table 1 by a reactive sputtering method. The thin film-deposited diamond compacts were brazed to steel at 700° C. by the use of a silver brazing material (JIS BAg-1) to measure the bonding strengths, thus obtaining results as shown in Table 1. In these compacts were found no occurrence of cracks.

TABLE 1

| Sample No. | Thin Film Composition | Film Thickness (μm) | Brazing Strength (kg/mm$^2$) |
|---|---|---|---|
| 1 | TiC | 0.5 | 12 |
| 2 | TiC | 1 | 20 |
| 3 | TiC | 10 | 23 |
| 4 | ZrC | 10 | 21 |
| 5 | HfC | 10 | 20 |
| 6 | VC | 10 | 20 |
| 7 | NbC | 10 | 18 |
| 8 | TaC | 10 | 20 |
| 9 | CrC | 10 | 19 |
| 10 | MoC | 10 | 20 |
| 11 | WC | 10 | 20 |

EXAMPLE 3

A diamond compact comprising 88% by volume of diamond with a mean grain size of 1 μm, 5% by volume of (Mo, W)C and 7% by volume of Ni and Co was worked and finished in an outer diameter of 5 mm and height of 4 mm.

A thin film of TiC with a thickness of about 10 μm was deposited on the surface of the diamond compact by a plasma assisted CVD method in an analogous manner to Example 1. This thin film was strongly bonded to the diamond compact. Analysis of the thin film showed that it consisted of $TiC_{0.97}$ and there was no free carbon.

Figure 5A:
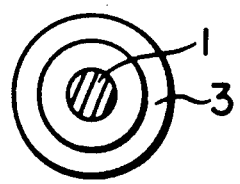
Figure 5B:
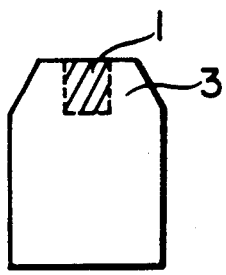

When the diamond compact was brazed to stainless steel at 740° C. by the use of a silver brazing material (JIS BAg-3) as shown in FIG. 5, a strong bonding was given without occurrence of cracks.

EXAMPLE 4

A diamond compact comprising 85% by volume of diamond grains with a mean grain size of 1 μm or less, 5% by volume of WC and 10% by volume of Co was prepared and worked in an outer diameter of 3 mm and height of 15 mm. This compact was subjected to reactive ion plating to deposit thereon a thin film of (Ti, W)C with a thickness of 5 μm at a temperature of 650° C.

Figure 6:
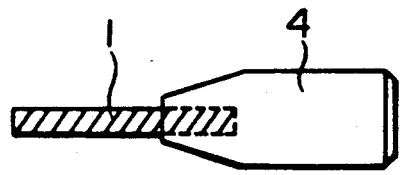
FIG. 6 is a schematic view of one embodiment of a hard compact of the present invention, brazed to a shank of cemented carbide.

The resulting compact was bonded to a shank made of a cemented carbide as shown in FIG. 6 by the use of a silver brazing material (JIS BAg-1) and then machined to prepare a drill. This drill could sufficiently be applied to drilling of an Al-Si alloy without occurrence of cracks.

EXAMPLE 5

A binder containing $TiN_{0.8}$ and Al in a proportion of 4:1 by volume and having a grain size of 1 μm or less was prepared, mixed with CBN powder with a grain size of 1 μm in a proportion of 1:1 by volume, charged in a vessel made of Mo and held for 10 minutes at an ultra-high pressure and high temperature (45 kb, 1300° C.). The resulting compact was taken out of the vessel to separate a CBN compact.

The surface of the resulting CBN compact was cleaned by sputter etching and then coated with a titanium carbide layer with a thickness of 10 μm by a plasma assisted CVD method comprising heating and holding the CBN compact for 3 hours in mixed gases of $TiCl_4$, $CH_4$ and $H_2$ at 750° C. to form a thin film of $TiC_{0.91}$.

Figure 7:
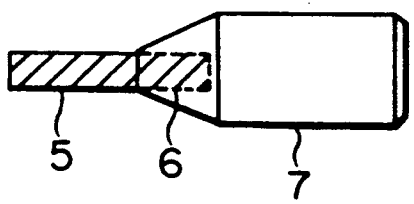
FIG. 7 is a schematic view of one embodiment of a high pressure form BN compact brazed to a holder according to the present invention.
Figure 8:
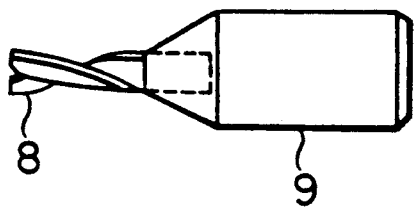
FIG. 8 is a schematic view of a spiral end mill made by machining the composite compact of FIG. 1 (a).

The thus obtained CBN compact was brazed to a cemented carbide by the use of a silver brazing material corresponding to JIS BAg-3 as shown in FIG. 7, then subjected to grooving as shown in FIG. 8 and finished in a spiral end mill with a diameter of 3 mm. Observation of the CBN compact after brazing showed no occurrence of cracks.

Using this end mill, a metallic mold (HRC 53) corresponding to SKD 61 was subjected to cutting under conditions of a revolution of 6000, cutting depth of 1 mm and feed of 120 mm/min. The CBN compact of the present invention was able to resist cutting without stripping from the brazed part.

EXAMPLE 6

A CBN compact containing 60% by volume of CBN powder with a grain size of 3 μm and the balance of Ti(C, N), AlN, $AlB_2$ and $TiB_2$ was prepared. On the whole surface of the CBN compact were deposited thin films shown in Table 2 with various thicknesses by a reactive sputtering method.

The thin film-deposited CBN compacts were brazed to a cemented carbide at 750° C. by the use of a silver brazing material (JIS BAg-3) to measure the bonding strengths, thus obtaining results as shown in Table 2. In these compacts were found no occurrence of cracks during brazing.

TABLE 2

| Sample No. | Thin Film Composition | Film Thickness ($\mu m$) | Brazing Strength ($kg/mm^2$) |
|---|---|---|---|
| 12 | $TiC_{0.95}$ | 0.5 | 13 |
| 13 | $TiC_{0.97}$ | 1 | 21 |
| 14 | $TiC_{0.90}$ | 5 | 25 |
| 15 | $TiC_{0.50}$ | 20 | 26 |
| 16 | $TiC_{1.01}$ | 10 | 10 |
| 17 | $ZrC_{0.81}$ | 5 | 25 |
| 18 | $HfC_{0.80}$ | 5 | 24 |
| 19 | $VC_{0.82}$ | 5 | 23 |
| 20 | $NbC_{0.90}$ | 5 | 21 |
| 21 | $TaC_{0.91}$ | 5 | 23 |
| 22 | $CrC_{0.90}$ | 5 | 20 |
| 23 | $MoC_{0.91}$ | 5 | 22 |
| 24 | $WC_{0.99}$ | 5 | 22 |
| 25 | $(Mo,W)C_{0.96}$ | 5 | 22 |
| 26 | $(Ti,Zr)C_{0.80}$ | 5 | 25 |
| 27 | $(Ti,Hf)C_{0.8}$ | 5 | 23 |
| Comparison Cemented Carbide-Cemented Carbide | | | 26 |

For comparison, cemented carbides were bonded with each other using a brazing material corresponding to JIS BAg-3 to measure the bonding strength.

EXAMPLE 7

A high pressure form BN compact comprising 85% by volume of CBN powder with a mean grain size of 3 $\mu m$ and wBN powder with a mean grain size of 1 $\mu m$ or less mixed in a proportion of 4:1 by volume and the balance of TiC-WC and AlN was prepared and subjected to reactive ion plating to deposit thereon a thin film of $(Ti, Ta, W)C$ with a thickness of 5 $\mu m$ at a temperature of 800° C.

The resulting compact was brazed to a steel material (S45C) in vacuum using an amorphous Ni brazing material having a melting point of 850° C. After brazing, there was found no occurrence of cracks in the compact. The bonding strength of the compact of the present invention was measured to give 35 $kg/mm^2$.

EXAMPLE 8

Diamond powder with a mean grain size of 1 $\mu m$ was pulverized for 10 hours using a pot and balls, made of WC-10% Co. The resulting powder was charged in a vessel made of WC-12% Co, where it was covered with a Co plate. This vessel was charged in an ultra-high pressure and high temperature apparatus and held for 15 minutes at a pressure of 55 kb and a temperature of 1500° C. The compact part contained 85% by volume of diamond, 5% by volume of WC and 10% by volume of Co.

The surface of the resulting compact was cleaned by sputter etching and then coated with a thin film layer consisting of titanium carbide ($TiC_{0.98}$) and having a thickness of about 3 $\mu m$ by a plasma assisted CVD method comprising heating and holding the compact at 700° C. in mixed gases of $TiCl_4$, $CH_4$ and $H_2$ for 1 hour.

Figure 9:
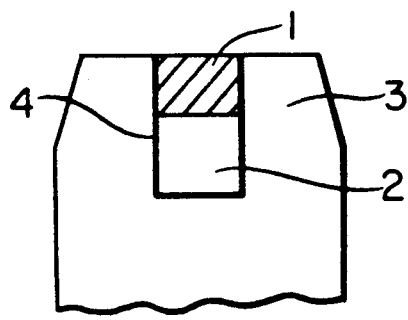
FIG. 9 is a cross-sectional view of a hard compact brazed to a holder in Example 8 according to the present invention.

When this compact was brazed to a steel holder by the use of a silver brazing material corresponding to JIS BAg-3 as shown in FIG. 9, the brazing reached the diamond compact part.

For comparison, another compact whose diamond compact part had no coating of $TiC_{0.98}$ was similarly brazed to a steel holder. In this case, however, the brazing material was not wetted with the diamond compact part and there was found a clearance between the holder and compact part.

When the tools obtained in this example and comparative example were polished by a diamond wheel, the compact was uniformly finished and could be used as a wear resisting part in the present invention, but the edge of the compact near the clearance was broken during the polishing and the compact could not be used as a wear resisting part in the comparative example.

EXAMPLE 9

A composite compact was prepared in which a CBN compact part containing 70% by volume of CBN powder with a mean grain size of 5 $\mu m$ and the balance of TiN, WC and Al mixed in a proportion of 6:1:3 by volume was bonded to a cemented carbide substrate through an interlayer. The interlayer had a thickness of 0.03 mm and contained 50% by volume of CBN and the balance of TiC and Al mixed in a proportion of 8:2 by volume.

After cutting the compact, the surface of the CBN compact was cleaned by sputter etching and then subjected to plasma assisted CVD to form thereon a thin film layer consisting of $TiC_{0.8}$ with a thickness of about 5 $\mu m$. During the same time, the thin film layer was formed by heating and holding the CBN compact in mixed gases of $TiCl_4$, $CH_4$ and $H_2$ at 750° C. for 2 hours.

Figure 10:
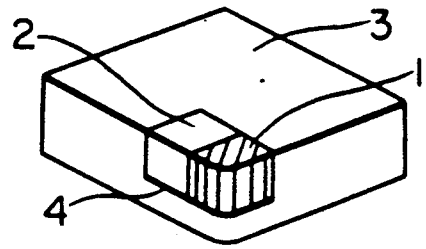
FIG. 10 and FIG. 11 are respectively perspective views of hard compacts brazed to holders in Examples 9 and 10 according to the present invention.

This CBN compact was brazed to a holder made of a cemented carbide by the use of a silver brazing material, as shown in FIG. 10 or FIG. 12 (a) or (b). The brazing material was well wetted with not only the cemented carbide substrate, but also the CBN compact part to give a strong bonding of the compact and holder.

Figure 1A:
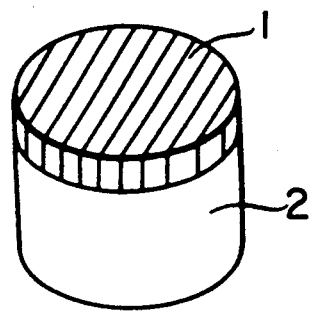
Figure 2:
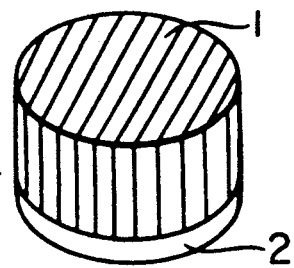
Figure 1B:
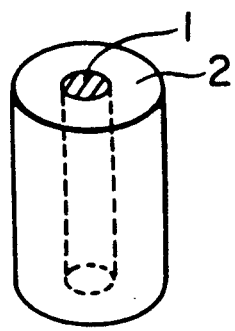
Figure 3A:
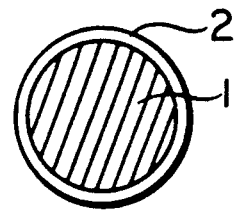
Figure 3B:
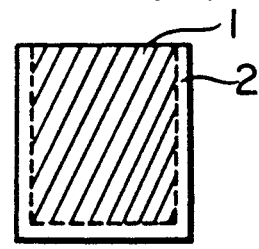
Figure 4A:
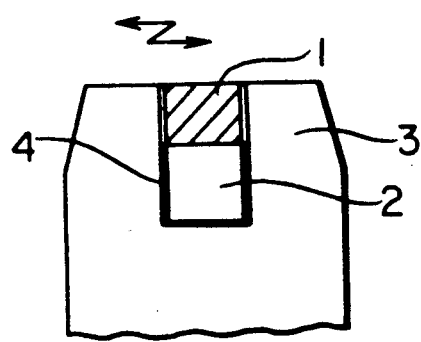
Figure 4B:
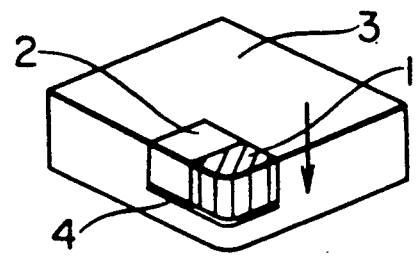

For comparison, a tool of the prior art as shown in FIG. 4 (b) was prepared in an analogous manner to this example except that the surface of the compact was not coated with the carbide thin film and used as a comparative tool.

When workpieces of SKD 11 (HRC 60) each having a V-groove were subjected to cutting under conditions of: cutting speed 100 m/min, cutting depth 0.5 mm and feed 0.2 mm/rev by the tools obtained in this example and comparative example, the compact of the example according to the present invention did not meet with breaking or cracking of the edge even by cutting for 30 minutes, while the compact of the comparative example cracked by cutting for only 15 seconds.

EXAMPLE 10

On a cemented carbide substrate was bonded a diamond compact part comprising 90% by volume of diamond powder with a mean grain size of 10 $\mu m$ and the balance of (W, Ti)C and Co through an interlayer having a thickness of 0.05 mm and comprising 60% by volume of CBN and the balance of TiN, WC and Al mixed in a proportion of 5:2:3 by volume to prepare a hard compact. Thin films having compositions as shown in Table 3 were formed on the diamond compact part by a high frequency sputtering method while heating the diamond compact part at 600° C.:

TABLE 3

| Sample No. | Thin Film Composition | Film Thickness ($\mu m$) | Results of Brazing | Results of Grinding |
|---|---|---|---|---|
| 28 | $TiC_{0.8}$ | 0.5 | partly brazable | broken |
| 29 | $TiC_{0.8}$ | 1 | wholly brazable | not broken |
| 30 | $TiC_{0.98}$ | 2 | " | " |
| 31 | $(Ti,Hf)C_{0.98}$ | 5 | " | " |
| 32 | $ZrC_{0.8}$ | 10 | " | " |
| 33 | $(Ti,W)C_{0.85}$ | 15 | " | " |
| 34 | $(Ti,Ta)C_{0.8}$ | 5 | " | " |
| 35 | $(Mo,W)$ | 5 | " | " |

TABLE 3-continued

| Sample No. | Thin Film Composition | Film Thickness (μm) | Results of Brazing | Results of Grinding |
|---|---|---|---|---|
| 36 | $C_{0.8}$ $VC_{0.8}$ | 25 | " | " |
| Comparison | no thin film | | not brazable | broken |

Figure 11:
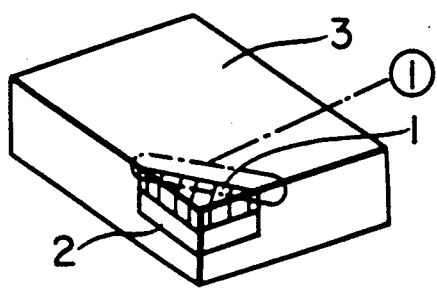

Each of these compacts was brazed to a holder made of a cemented carbide as shown in FIG. 11 by the use of a silver brazing material corresponding to JIS BAg-1. The brazed state of the diamond compact part was observed and thereafter, the upper surface was subjected to surface grinding by a diamond grinder, followed by observing the broken state of the compact part at a position represented by in FIG. 11. These results are shown in Table 3.

EXAMPLE 11

Onto a cemented carbide substrate was bonded a compact part comprising 50% by volume of CBN and the balance of (Ti, Ta, W, Mo) (C, N), Al and Si in a proportion of 7:2:1 by volume to prepare a hard compact. Thin films of compositions shown in Table 4 were formed on the surface of the resulting compact by a reactive ion plating method.

TABLE 4

| Sample No. | Thin Film Composition | Film Thickness (μm) | Results of Brazing | Results of Grinding |
|---|---|---|---|---|
| 37 | $TiC_{0.7}$ | 0.5 | partly brazable | brazing broken in 5 minutes |
| 38 | (Ti, Zr)C | 1 | brazable | nothing abnormal in cutting for 20 minutes |
| 39 | HfC | 10 | " | " |
| 40 | Ti, V)C | 20 | " | " |
| 41 | TaC | 25 | " | " |
| 42 | (Ti, Nb)C | 15 | " | " |
| 43 | (Mo, W)C | 10 | " | " |
| 44 | WC | 10 | " | " |
| Comparison | no thin film | | not brazable | brazing broken in 3 minutes |

The shape of the above described blank was a right-angled isosceles triangle whose one side was 2.5 mm, in which the compact part layer had a thickness of 0.8 mm and the cemented carbide substrate had a thickness of 0.8 mm.

Each of these compact was brazed to a holder made of a cemented carbide as shown in FIG. 11 by the use of a silver brazing material corresponding to JIS BAg-1 and the brazed state of the hard compact was observed. These inserts were machined in SNG 432 to prepare cutting inserts and using these cutting inserts, a round bar of SKD 11 with a hardness of HRC 61 was subjected to cutting under conditions of a cutting speed of 150 m/min, cutting depth of 0.5 mm and feed of 0.3 mm/rev, thus obtaining results as shown in Table 4.

EXAMPLE 12

Diamond powders each having a mean grain size of 100 μm, 50 μm, 20 μm and 5 to 0.2 μm were mixed for 5 minutes in a proportion of 5:3:1:1 by volume using a pot and balls, made of a cemented carbide of WC-Co. The resulting mixed powders were heated at 1400° C. for 30 minutes in vacuum and then charged in a Mo vessel, where the powders were covered with a Co plate. Using an ultra-high pressure apparatus, the powders were first pressed at 55 kb, then heated at 1460° C. and held for 10 minutes. The thus sintered compact was taken out of the vessel and subjected to chemical analysis to determine the contents of diamond, WC and Co. The contents of diamond, WC and Co were 96.5% by volume, 0.15% by volume and 3.35% by volume.

The thus obtained compact was immersed in aqua regia heated to dissolve out Co and the composition was determined by a magnetic balance and chemical analysis, thus obtaining 96.5% by volume of diamond, 0.14% by volume of WC, 0.4% by volume of Co and 2.96% by volume of pores.

On the surface of the resulting compact was formed a coating layer consisting of titanium carbide with a thickness of about 8 μm by a CVD method comprising holding the compact at 1000° C. for 6 hours in mixed gases of $TiCl_4$, $CH_4$ and $H_2$. The thus processed heat resisting diamond compact was heated at a temperature of up to 1000° C. in the atmosphere to measure the change of its weight.

The above described heat resistance diamond compact was used as a sample (a). For comparison, furthermore, the diamond compact before coating titanium carbide was used as a comparative sample (b), a commercially available diamond compact containing 85% by volume of diamond and 10.5% by volume of pores was used as a comparative sample (c) and the diamond compact of the sample (c), coated with a nickel layer with a thickness of 50 μm, was used as a sample (d). These comparative samples were subjected to measurement of the weight change.

The heating for measuring the weight change was carried out under the following conditions:
Heating Temperature: room temperature to 1000° C.
Atmosphere: in the air
Temperature Raising Speed: 10° C./min The measurement results as to the above described weight change are shown in FIG. 13. It is apparent from the results of FIG. 13 that in the comparative sample (b) whose heat resistance is improved only by the acid leaching, decrease of the weight starts at approximately 800° C., in the sample (a) according to the present invention, obtained by forming a coating layer of titanium carbide on the comparative sample (b), the weight is not so decreased even at a temperature exceeding 950° C. and in the comparative sample (d) obtained by coating a commercially available diamond compact with nickel, the weight decrease starts at a temperature of about 850° C.

Observation of the interface between the nickel layer of the comparative sample (d) and the diamond compact layer by a microscope showed that the diamond was graphitized.

It will clearly be understood from the above described results that the diamond compact of the sample (a) according to the present invention has a largely improved heat resistance in the atmosphere.

EXAMPLE 13

On the surface of a diamond compact comprising 96.2% by volume of diamond, 0.3% by volume of Co, 0.15% by volume of WC and 3.35% by volume of pores was formed a coating layer consisting of silicon carbide by a CVD method comprising holding the compact at 900° C. for 3 hours in an atmosphere consisting of $SiCl_4$, $CH_4$ and $H_2$. The coating layer of silicon carbide had a thickness of 5 μm.

The thus resulting sample (e) and the samples (a), (b), (c) and (d) used in Example 12 were heated and held at 900° C. for 5 minutes in the air, cooled and then subjected to measurement of the compressive strength, and the same samples but not heat treated were also subjected to measurement of the compressive strength.

The shape of the sample used in the above described measurement of the compressive strength is a cube whose one side has a length of 2.5 mm and two facing surfaces are held at a parallel degree of less than 0.01 mm so as to prevent the sample from bending or breakage due to shearing. The results are shown in FIG. 14.

It will be apparent from the results of FIG. 14 that the diamond compacts coated with titanium carbide and silicon carbide, that is, the samples (a) and (e) are free from deterioration due to graphitization of diamond grains even after heating at 900° C. in the air and accordingly, hardly meet with lowering of the compressive strength.

EXAMPLE 14

Diamond powder with a mean grain size of 0.8 μm was pulverized and mixed by the use of a pot and balls, made of a cemented carbide of WC-Co. This powder was mixed with diamond powders each having a means grain size of 60 μm, 30 μm and 10 μm in a proportion of 1:5:3:1 by volume, then heated at a temperature of 1450° C. for 1 hour in vacuum and sintered at a pressure of 55 Kb and a temperature of 1450° C. in an analogous manner to Example 12. Chemical analysis of the resulting diamond compact showed a composition comprising 96.2% by volume of diamond, 0.1% by volume of Ni and 0.2% by volume of WC. When this compact was treated with heated aqua regia, there was formed 3.3% by volume of pores or voids.

On the surface of the thus obtained diamond compact was formed a coating layer of titanium carbide by a CVD method comprising holding the compact in mixed gases of $TiCl_4$, $CH_4$ and $H_2$ at 1000° C. for 0.2 to 30 hours.

Observation of the interface between the coating layer and diamond compact by SEM (Scanning Electron Microscope) showed that the coating layers had a thickness in the range of 0.5 to 60 μm.

Using the diamond compacts having titanium carbide coating layers differing in film thickness, which had been formed as described above, a workpiece of alumina with a Vickers hardness of 2300 was subjected to cutting by wet process for 10 minutes under conditions of a cutting speed of 50 m/min, cutting depth of 0.2 mm and feed of 0.05 mm/rev.

In addition, the coating layer-formed diamond compacts were subjected to a cutting test under the same conditions after heating at 900° C. in the air.

The samples used in the above described cutting tests and the thickness of the coating layers in the samples are shown in Table 5 and the results of the cutting tests are shown in FIG. 15.

TABLE 5

| Sample No. | f | g | h | i | j | k | l |
|---|---|---|---|---|---|---|---|
| Film Thickness (μm) | 0.5 | 1.0 | 8.0 | 15.0 | 37.0 | 50.0 | 60.0 |

It is apparent from FIG. 15 that if the thickness of the coating layer is less than 1 μm, the wear resistance is good surely before heating, but is largely lowered after heating. Observation of the surface of the sample (f), i.e. diamond compact having the coating layer with a thickness of 0.5 μm showed graphitization of diamond grains.

EXAMPLE 15

The surface of the diamond compact having the same composition as that used in Example 14 and having been treated with heated aqua regia in the similar manner was coated with carbides of transition metals of Group IVa, Va and VIa of Periodic Table and silicon carbide by reactive sputtering as shown in Table 6. The thickness of the coating layers were in the range of 6 to 8 μm.

TABLE 6

| Sample No. | m | n | o | p | q | r |
|---|---|---|---|---|---|---|
| Coating Material | TaC | $Cr_3C_2$ | VC | HfC | ZrC | SiC |
| Film Thickness (μm) | 8 | 8 | 6 | 6 | 7 | 6 |

The coating layer-formed diamond compacts were heated at a temperature of up to 1100° C. in the air to measure the weight change. For comparison, the same diamond compact but not coated with the carbide layer was similarly subjected to the heating test. The results are shown in FIG. 16.

It is apparent from FIG. 16 that the coated diamond compacts each exhibits a less decrease of the weight at a temperature of lower than 900° C. irrespective of the variety of carbides and gives a weight decrease-starting temperature of at least 100° C. higher than that of the non-coated diamond compact, i.e. about 800° C.

EXAMPLE 16

Diamond compacts having compositions as shown in Table 7 were coated with a coating layer of silicon carbide with a thickness of 5 μm and then subjected to measurement of the compressive strength.

FIG. 17 shows change of the compressive strength with the quantity of pores in the diamond compacts.

It is apparent from FIG. 17 that the compressive strength is increased with the decrease of the quantity of pores or voids, i.e. with the increase of the content of diamond and when the quantity of pores is 20% by volume or more, the compressive strength is 100 kg/mm² or less.

TABLE 7

| Sample No. | Diamond Content (vol %) | Quantity of Co and WC (vol %) | Quantity of Pores (vol %) |
|---|---|---|---|
| s | 70.0 | 0.53 | 29.47 |

TABLE 7-continued

| Sample No. | Diamond Content (vol %) | Quantity of Co and WC (vol %) | Quantity of Pores (vol %) |
|---|---|---|---|
| t | 78.5 | 0.54 | 20.96 |
| u | 82.2 | 0.49 | 17.31 |
| v | 88.0 | 0.50 | 11.50 |
| w | 92.9 | 0.43 | 6.67 |
| x | 95.1 | 0.43 | 4.47 |
| y | 97.0 | 0.41 | 2.59 |

EXAMPLE 17

The surface of a diamond compact comprising 98.5% by volume of diamond, 0.4% by volume of Co, 0.12% by volume of WC and 0.98% by volume of pores was coated with a layer of TiN, layer of TiCN and two layers of TiN and TiC by a CVD method under conditions shown in Table 8. The thickness of the coating layers was 8 μm by SEM observation. The thus resulting samples α, β and γ were heated at 950° C. in the air, held for 5 minutes, cooled and then subjected to measurement of the compressive strength. For comparison, each of the samples which had not heat treated was subjected to measurement of the compressive strength. The results are shown in FIG. 18.

It is apparent from FIG. 18 that any of the coated diamond compacts does not show lowering of the compressive strength after heating.

TABLE 8

| Sample No. | Coating Layer | Atmosphere |
|---|---|---|
| α | TiN | $TiCl_4, N_2, H_2$ |
| β | TiCN | $TiCl_4, N_2, H_2, CH_4$ |
| γ | TiC + TiN (outer layer) | $TiCl_4, CH_4, H_2$ $TiCl_4, N_2, H_2$ |

What is claimed is:

1. A hard sintered compact for a tool, comprising a compact part containing at least 20% by volume of diamond and/or high pressure form boron nitride and a cemented carbide substrate bonded directly or through an interlayer to the compact part, characterized in that the surface of the compact part is coated, at least partly, with a thin film consisting essentially of at least one member selected from the group consisting of carbides, carbonitrides and nitrides and mixtures or solid solutions thereof of at least one element selected from the group consisting of silicon and Group IVa, Va and VIa of Periodic Table, and having a thickness of 1 to 20 μm.

2. The hard sintered compact of claim 1, wherein the compact part comprises at least 80% by volume of diamond and the balance of a binder consisting of at least one member selected from the group consisting of iron group metals and carbides of at least one metal selected from the group consisting of Group IVa, Va and VIa metals of Periodic Table.

3. The hard sintered compact of claim 1, wherein the thin film consists of a metal carbide represented by the general formula $MC_{1-x}$ wherein M is a metal selected from the group consisting of Group IVa, Va and VIa metals of Periodic Table and x is 0.5 to 0.025.

4. The hard sintered compact of claim 1, wherein the compact part contains 20 to 90% by volume of high pressure form boron nitride and the balance of a binder consisting of at least one member selected from the group consisting of nitrides, carbides, carbonitrides and borides of at least one metal selected from the group consisting of Group IVa, Va and VIa metals of Periodic Table, mixtures and solid solutions thereof.

5. The hard sintered compact of claim 4, wherein the binder further contains at least 1% by volume, based on the binder, of at least one member selected from the group consisting of aluminum and silicon.

6. The hard sintered compact of claim 1, wherein the thin film consists of titanium carbide.

7. The hard sintered compact of claim 1, wherein the compact part contains 80 to 99% by volume of diamond powder, 0.5 to 19.9% by volume of pores and 0.1 to 3% by volume of a carbide of a transition metal of Group IVa, Va or VIa of Periodic Table and has a coating layer consisting of at least one member selected from the group consisting of carbides, nitrides and carbonitrides of transition metals of Group IVa, Va and VIa of Periodic Table and silicon, and having a thickness of at least 1 μm.

8. The hard sintered compact of claim 1, wherein the thin film is formed by a method selected from the group consisting of a CVD method, plasma assisted CVD method, PVD method and reactive sputtering method.

9. The hard sintered compact of claim 1, wherein the thin film is formed while heating the compact part at a temperature of at least 500° C.

10. The hard sintered compact of claim 1, wherein the interlayer consists essentially of a mixture of cubic boron nitride and aluminum or silicon and at least one member selected from the group consisting of carbides, nitrides and carbonitrides of Group IVa, Va and VIa elements of Periodic Table.

11. The hard sintered compact of claim 1, wherein the thin film is coated through another coating layer.

* * * * *